(12) United States Patent
Jones et al.

(10) Patent No.: US 8,659,221 B2
(45) Date of Patent: Feb. 25, 2014

(54) OLED LIGHT EXTRACTION FILM WITH MULTI-PERIODIC ZONES OF NANOSTRUCTURES

(75) Inventors: Vivian W. Jones, Woodbury, MN (US); Sergey A. Lamansky, Apple Valley, MN (US); James M. Nelson, Lino Lakes, MN (US); Ha T. Le, Saint Paul, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 172 days.

(21) Appl. No.: 13/218,610

(22) Filed: Aug. 26, 2011

(65) Prior Publication Data

US 2013/0051032 A1 Feb. 28, 2013

(51) Int. Cl.
*H01J 1/62* (2006.01)
*H01J 63/04* (2006.01)

(52) U.S. Cl.
USPC ............ 313/506; 313/498; 313/504; 313/512

(58) Field of Classification Search
USPC .................... 313/498–512; 257/99, E51.018; 359/586, 587, 599
See application file for complete search history.

(56) References Cited

U.S. PATENT DOCUMENTS

| | | | |
|---|---|---|---|
| 5,919,551 A | 7/1999 | Cobb | |
| 7,130,124 B2 | 10/2006 | Ketterson | |
| 7,140,812 B2 | 11/2006 | Bryan | |
| 7,468,211 B2 | 12/2008 | McCormick | |
| 2006/0049745 A1* | 3/2006 | Handa et al. ................. | 313/503 |
| 2007/0020451 A1 | 1/2007 | Padiyath | |
| 2009/0015142 A1 | 1/2009 | Potts | |
| 2009/0015757 A1 | 1/2009 | Potts | |
| 2009/0166666 A1* | 7/2009 | Yao et al. ...................... | 257/101 |
| 2010/0128351 A1 | 5/2010 | Epstein | |
| 2010/0133529 A1* | 6/2010 | Taraschi et al. ................ | 257/43 |
| 2010/0238529 A1 | 9/2010 | Sampsell | |
| 2011/0229992 A1* | 9/2011 | Potts et al. ...................... | 438/27 |
| 2011/0241539 A1* | 10/2011 | Yan et al. ...................... | 313/504 |
| 2012/0007135 A1* | 1/2012 | Yao et al. ......................... | 257/99 |
| 2012/0098421 A1* | 4/2012 | Thompson .................... | 313/512 |
| 2012/0234460 A1 | 9/2012 | Zhang | |

FOREIGN PATENT DOCUMENTS

| | | |
|---|---|---|
| EP | 1860471 | 11/2007 |
| KR | 1012299 | 7/2010 |
| WO | WO 2010/077070 | 7/2010 |
| WO | WO 2010/077521 | 7/2010 |

OTHER PUBLICATIONS

Delbeke, Electrically Pumped Grating-Assisted Resonant-Cavity Light-Emitting Diodes, *Proc. SPIE*, 2002, vol. 4641, pp. 42-49.

(Continued)

*Primary Examiner* — Anh Mai
*Assistant Examiner* — Kevin Quarterman
(74) *Attorney, Agent, or Firm* — Lance L. Vietzke

(57) ABSTRACT

A light extraction film having multi-periodic zones of engineered nanostructures. The light extraction film includes a flexible substrate, a layer of low index engineered nanostructures applied to the substrate, and a high index backfill layer applied over the nanostructures. The multi-periodic zones include a repeating zone of the nanostructures having multi-periodic characteristics. The repeating zone includes first and second sets of nanostructures having different periodic pitches. The multi-periodic zones can be used to enhance the light output and tune the angular luminosity of organic light emitting diode devices.

11 Claims, 3 Drawing Sheets

(56) References Cited

OTHER PUBLICATIONS

Fujita, "Optical and Electrical Characteristics of Organic Light-Emitting Diodes with Two-Dimensional Photonic Crystals in Organic/Electrode Layers", *Japanese Journal of Applied Physics*, 2005, vol. 44, No. 6A, pp. 3669-3677.

Nakanishi, "Improvement of the light extraction efficiency of top-emitting organic light-emitting diodes by a two-dimensional diffraction layer fabricated using self-assembled nanoparticles", *Applied Optics*, Nov. 2009, vol. 48, No. 31, pp. 5889-5896.

Ziebarth, "Extracting Light from Polymer Light-Emitting Diodes Using Stamped Bragg Gratings", *Advanced Functional Materials*, 2004, vol. 14, No. 5, pp. 451-456.

\* cited by examiner

OLED LIGHT EXTRACTION FILM WITH MULTI-PERIODIC ZONES OF NANOSTRUCTURES

BACKGROUND

Organic Light Emitting Diode (OLED) devices include a thin film of electroluminescent organic material sandwiched between a cathode and an anode, with one or both of these electrodes being a transparent conductor. When a voltage is applied across the device, electrons and holes are injected from their respective electrodes and recombine in the electroluminescent organic material through the intermediate formation of emissive excitons.

In OLED devices, over 70% of the generated light is typically lost due to processes within the device structure. The trapping of light at the interfaces between the higher index organic and Indium Tin Oxide (ITO) layers and the lower index substrate layers is the major cause of this poor extraction efficiency. Only a relatively small amount of the emitted light emerges through the transparent electrode as "useful" light. The majority of the light undergoes internal reflections, resulting in light being emitted from the edge of the device or trapped within the device and eventually being lost to absorption within the device after making repeated passes.

Light extraction films use internal nanostructures to avoid waveguiding losses within the device. While providing strong light extraction, internal nanostructures, comprising regular features such as photonic crystals or linear gratings, tend to produce diffraction-related variations in the angular and spectral distributions of the emitted light, which may not be desirable in final applications. Thus, a need exists for a light extraction film that simultaneously enhances the efficiency of light extraction via the nanostructures, while also reducing undesirable luminance and color angular non-uniformity in the light output.

SUMMARY

A light extraction film, consistent with the present invention, includes a flexible substrate, a layer of low index engineered nanostructures applied to the substrate, and a high index backfill layer applied over the nanostructures and forming a substantially planar surface on a surface of the backfill layer opposite the nanostructures. The engineered nanostructures have multi-periodic zones including a repeating zone of the nanostructures. The repeating zone comprises first and second sets of nanostructures having different periodic pitches.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Embodiments of the present invention relate to light extraction films and uses of them for OLED devices. Examples of light extraction films are described in U.S. Pat. Applications Publication Nos. 2009/0015757 and 2009/0015142, both of which are incorporated herein by reference as if fully set forth.

Figure 1:
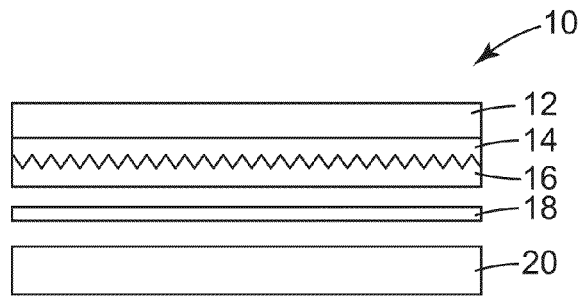
FIG. 1 is a diagram illustrating layers of a light extraction film.

FIG. 1 is a diagram of the construction of a light extraction film 10 having multi-periodic zones of engineered nanostructures. Light extraction film 10 includes a substantially transparent substrate 12 (flexible, rigid, or in a window layer), low index multi-periodic engineered nanostructures 14, and a high index backfill layer 16 forming a substantially planar surface over multi-periodic nanostructures 14. The term "substantially planar surface" means that the backfill layer planarizes the underlying layer, although slight surface variations may be present in the substantially planar surface. When the planar surface of the backfill layer is placed against the light output surface of the OLED device the nanostructures at least partially enhance light output from the OLED device. The backfill planar surface can be placed directly against the OLED light output surface or through another layer between the planar surface and light output surface.

The light extraction film is typically made as a separate film to be applied to an OLED device. For example, an optical coupling layer 18 can be used to optically couple light extraction film 10 to a light output surface of an OLED device 20. Optical coupling layer 18 can be applied to the light extraction film, the OLED device, or both, and it can be implemented with an adhesive to facilitate application of the light extraction film to the OLED device. As an alternative to a separate optical coupling layer, the high index backfill layer itself may be comprised of a high index adhesive, so that the optical and planarizing functions of the backfill, and the adhering function of the adhesive optical coupling layer, are performed by the same layer. Examples of optical coupling layers and processes for using them to laminate light extraction films to OLED devices are described in U.S. patent application Ser. No. 13/050,324, entitled "OLED Light Extraction Films Having Nanoparticles and Periodic Structures," and filed Mar. 17, 2011, which is incorporated herein by reference as if fully set forth.

The engineered nanostructures for light extraction film 10 can be formed integrally with the substrate or in a layer applied to the substrate. For example, the nanostructures can be formed on the substrate by applying to the substrate a low-index material and subsequently patterning the material. Engineered nanostructures are structures having at least one dimension, such as width, less than 1 micron. Engineered nanostructures are not individual particles but may be composed of nanoparticles forming the engineered nanostructures where the nanoparticles are significantly smaller than the overall size of the engineered structures.

The engineered nanostructures for light extraction film 10 can be one-dimensional (1D), meaning they are periodic in only one dimension, that is, nearest-neighbor features are spaced equally in one direction along the surface, but not along the orthogonal direction. In the case of 1D periodic nanostructures, the spacing between adjacent periodic features is less than 1 micron. One-dimensional structures include, for example, continuous or elongated prisms or ridges, or linear gratings.

The engineered nanostructures for light extraction film 10 can also be two-dimensional (2D), meaning they are periodic in two dimensions, that is, nearest neighbor features are spaced equally in two different directions along the surface. In the case of 2D nanostructures, the spacing in both directions is less than 1 micron. Note that the spacing in the two different directions may be different. Two-dimensional structures include, for example, lenslets, pyramids, trapezoids, round or square shaped posts, or photonic crystal structures. Other examples of two-dimensional structures include curved sided cone structures as described in U.S. Pat. Application Publication No. 2010/0128351, which is incorporated herein by reference as if fully set forth.

Materials for the substrates, low index multi-periodic structures, and high index backfill layers for light extraction film 10 are provided in the published patent applications identified above. For example, the substrate can be implemented with glass, PET, polyimides, TAC, PC, polyurethane, PVC, or flexible glass. Processes for making light extraction film 10 are also provided in the published patent applications identified above. Optionally, the substrate can be implemented with a barrier film to protect a device incorporating the light extraction film from moisture or oxygen. Examples of barrier films are disclosed in U.S. Pat. Application Publication No. 2007/0020451 and U.S. Pat. No. 7,468,211, both of which are incorporated herein by reference as if fully set forth.

FIGS. 2A-2E illustrate various exemplary configurations of zones of multi-periodic nanostructures having at least different pitches. A zone is a plurality of sets of engineered nanostructures proximate one another and non-overlapping. The sets can be directly adjacent one another, or adjacent one another and separated by a gap. Each set is a plurality of nanostructures adjacent one another with a periodic characteristic, and each set in a zone has a different periodic characteristic from the other sets in the zone. The engineered nanostructures in each set are thus not random and are not non-periodic. The zone repeats throughout the nanostructured surface of the light extraction film. In particular, the same plurality of sets in a zone repeats, resulting in a repeating variable periodic characteristic of the engineered nanostructures. The plurality of nanostructures in a set can include as few as two nanostructures, in which case the pitch (when used as the multi-periodic characteristic) is only the single distance between the two nanostructures in the set.

Examples of periodic characteristics include pitch, height, aspect ratio, and shape. Pitch refers to the distance between adjacent nanostructures, typically measured from their topmost portions. Height refers to the height of the nanostructures measured from their base (in contact with the underlying layer) to the topmost portion. Aspect ratio refers to the ratio of the cross-sectional width (widest portion) to height of the nanostructures. Shape refers to the cross-sectional shape of the nanostructures.

Controlling pitch through multi-pitch zones has been found to provide better angular distribution of OLED light extraction when compared with using a single pitch. Also, using multi-pitch zones provides for more uniform OLED light extraction and allows for tuning the light extraction for specific colors. The light extraction films thus use multi-periodic zones of pitch and may combine the multi-pitch zones with other multi-periodic characteristics such as those described above.

Figure 2A:
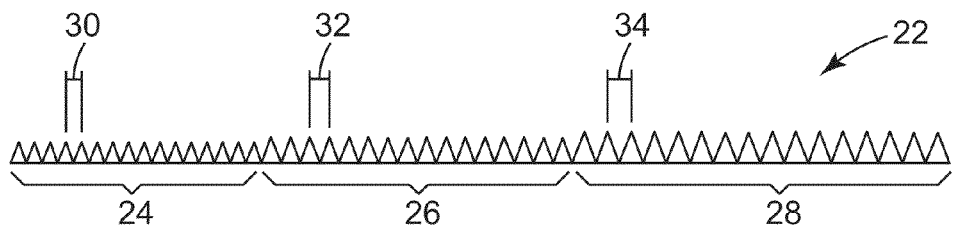
FIG. 2A is a diagram illustrating a first multi-periodic zone of nanostructures with different pitches.

FIG. 2A illustrates engineered nanostructures 22 with a zone having sets 24, 26, and 28. Each of the sets 24, 26, and 28 has a different pitch and feature height compared to the pitches and feature heights of the other sets in the zone. Set 24 has a periodic pitch 30, set 26 has a periodic pitch 32, and set 28 has a periodic pitch 34. The pitches 30, 32, and 34 do not equal each other. In one particular embodiment, pitch 30=0.420 microns, pitch 32=0.520 microns, and pitch 34=0.630 microns. The sets 24, 26, and 28 constituting the zone would then repeat to form the nanostructured surface of the light extraction film.

Figure 2B:
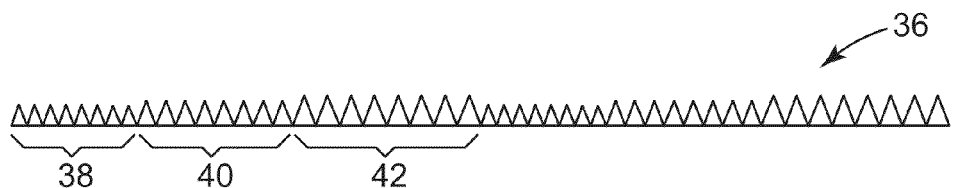
FIG. 2B is a diagram illustrating a second multi-periodic zone of nanostructures with different pitches.

FIG. 2B illustrates engineered nanostructures 36 with a repeating zone having sets of nanostructures 38, 40, and 42 each having a periodic pitch and feature height different from the other sets. In nanostructured surface 36, the zone is shown repeated twice. This example has fewer features in each set compared with the sets in FIG. 2A.

Figure 2C:
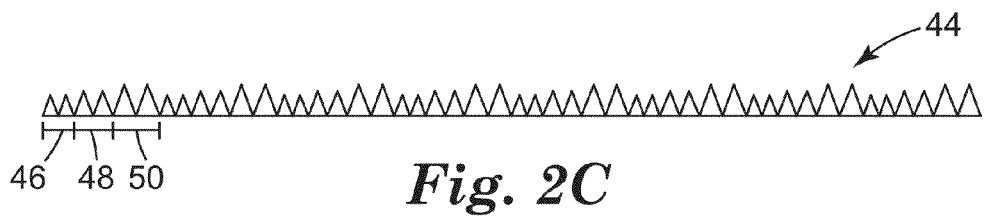
FIG. 2C is a diagram illustrating a third multi-periodic zone of nanostructures with different pitches.

FIG. 2C illustrates engineered nanostructures 44 with a repeating zone having sets of nanostructures 46, 48, and 50 each having a periodic pitch and feature height different from the other sets. In nanostructured surface 44, the zone is shown repeated eight times. This example has fewer features in each set compared with the sets in FIGS. 2A and 2B.

Figure 2D:
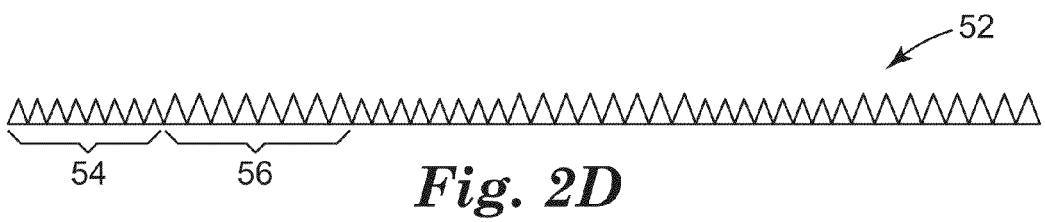
FIG. 2D is a diagram illustrating a fourth multi-periodic zone of nanostructures with different pitches.

FIG. 2D illustrates engineered nanostructures 52 with a repeating zone having sets of nanostructures 54 and 56 each having periodic a pitch and feature height different from the other set. In nanostructured surface 52, the zone is shown repeated three times. This example illustrates a zone having two sets compared with the zones having three sets in FIGS. 2A-2C.

Figure 2E:
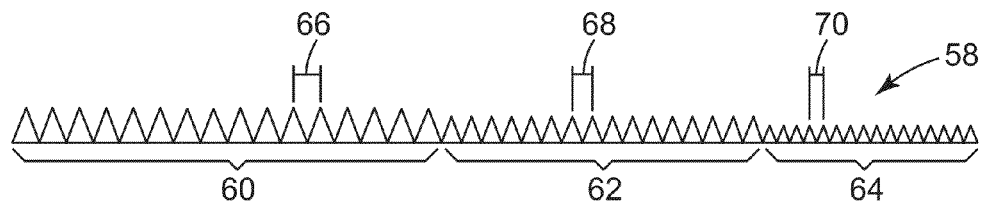
FIG. 2E is a diagram illustrating a fifth multi-periodic zone of nanostructures with different pitches.

FIG. 2E illustrates engineered nanostructures 58 with a zone having sets 60, 62, and 64. Each of the sets 60, 62, and 64 has a different pitch and feature height compared to the pitches and feature heights of the other sets in the zone. Set 60 has a periodic pitch 66, set 62 has a periodic pitch 68, and set 64 has a periodic pitch 70. The pitches 66, 68, and 70 do not equal each other. In one particular embodiment, pitch 66=0.750 microns, pitch 68=0.562 microns, and pitch 70=0.375 microns. The sets 60, 62, and 64 constituting the zone would then repeat to form the nanostructured surface of the light extraction film. This example illustrates a varying pitch in a zone increasing in a different direction compared with the varying pitch in the sets of FIG. 2A.

Figure 2F:
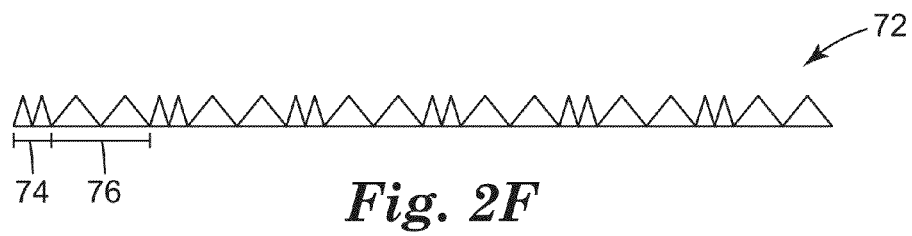
FIG. 2F is a diagram illustrating a multi-periodic zone of nanostructures with different aspect ratios
Figure 2G:
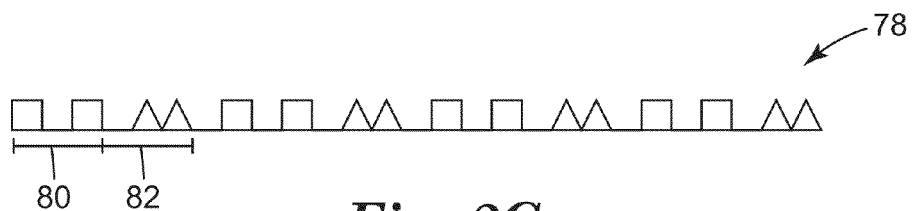
FIG. 2G is a diagram illustrating a multi-periodic zone of nanostructures with different shapes.

Aside from pitch and feature height, multi-periodic zones can have sets of other multi-periodic characteristics. FIG. 2F illustrates engineered nanostructures 72 having sets with multi-periodic aspect ratios. The repeating zone for nanostructures 72 includes sets 74 and 76 with the nanostructures in set 74 having a different aspect ratio from the nanostructures in set 76. As another example, FIG. 2G illustrates engineered nanostructures 78 having sets with multi-periodic shapes. The repeating zone for nanostructures 78 includes sets 80 and 82 with the nanostructures in set 80 having a different shape from the nanostructures in set 82. In this example, the nanostructures in set 80 can be implemented with 1D square ridges or 2D square posts, while the nanostructures in set 82 can be implemented with 1D elongated prisms or 2D pyramids.

The nanostructures in FIGS. 2A-2G are illustrative of periodic characteristics and zones. A zone can have two, three, or more sets of nanostructures with a periodic characteristic in each set and different from the values of the same periodic characteristic in the other sets. In FIGS. 2A-2E, the different pitches among sets in a zone are accomplished using nanostructures of different heights. However, the height of the nanostructures can be the same while the pitch among sets is different. The sets in a zone can thus have one or more different periodic characteristics among them. Also, FIGS. 2A-2E show prisms (or pyramids) as the engineered nanostructures for illustrative purposes; engineered nanostructures can include other types of 1D and 2D features such as those identified above.

EXAMPLES

All parts, percentages, ratios, etc. in the examples are by weight, unless noted otherwise. Solvents and other reagents used were obtained from Sigma-Aldrich Chemical Company; Milwaukee, Wis. unless specified differently.

Materials

| Abbreviation/Product Name | Description | Available from |
|---|---|---|
| IRGACURE 127 | Photoinitiator | Ciba Specialty Chemicals, Tarrytown, NY |
| PHOTOMER 6210 | aliphatic urethane diacrylate | Cognis Corporation, Cincinnati, OH |
| SILQUEST A-174 | 3-methacryloxypropyltrimethoxysilane | Momentive Performance Materials, Inc., Friendly, WV |
| SOLPLUS D510 | polyester-polyamine copolymer | Lubrizol, Cleveland, OH |
| SR238 | 1,6 hexanediol diacrylate | Sartomer Company, Exton, PA |
| SR833S | difunctional acrylate monomer | Sartomer Company, Exton, PA |
| TX13112 | colloidal solution | Nalco Chemical Company, Naperville, IL |

Preparative Examples

Preparation of D510 Stabilized 50 Nm $TiO_2$ Nanoparticle Dispersions

A $TiO_2$ nanoparticle dispersion with an approximately 52% wt of $TiO_2$ was prepared using a milling process in the presence of SOLPLUS D510 and 1-methoxy-2-propanol. The SOLPLUS D510 was added in an amount of 25% wt based on $TiO_2$ weight. The mixture was premixed using a DISPERMAT mixer (Paul N. Gardner Company, Inc., Pompano Beach, Fla.) for 10 minutes and then a NETZSCH MiniCer Mill (NETZSCH Premier Technologies, LLC., Exton, Pa.) was used with the following conditions: 4300 rpm, 0.2 mm YTZ milling media, and 250 ml/min flow rate. After 1 hour of milling, a white paste-like $TiO_2$ dispersion in 1-methoxy-2-propanol was obtained. The particle size was determined to be 50 nm (Z-average size) using a Malvern Instruments ZETASIZER Nano ZS (Malvern Instruments Inc, Westborough, Mass.).
Preparation of High Index Backfill Solution (HI-BF)
20 g of D510 stabilized 50 nm $TiO_2$ solution, 2.6 g of SR833S, 0.06 g of IRGACURE 127, 25.6 g of 1-methoxy-2-propanol, 38.4 g of 2-butanone were mixed together to form a homogenous high index backfill solution.
Fabrication of Nanostructured Film with 500 nm Pitch
A 500 nm "sawtooth" grating film was fabricated by first making a multi-tipped diamond tool as described in U.S. Pat. No. 7,140,812 (using a synthetic single crystal diamond, Sumitomo Diamond, Japan).

The diamond tool was then used to make a copper microreplication roll which was then used to make 500 nm 1D structures on a PET film in a continuous cast and cure process utilizing a polymerizable resin made by mixing 0.5% (2,4,6 trimethyl benzoyl) diphenyl phosphine oxide into a 75:25 blend of PHOTOMER 6210 and SR238.

HI-BF solution was coated onto the 500 nm pitch 1D structured film using a roll-to-roll coating process with a web speed of 4.5 m/min (15 ft/min) and a dispersion delivery rate of 5.1 cc/min. The coating was dried in air at room temperature, then subsequently further dried at 82° C. (180° F.) and then cured using a Fusion UV-Systems Inc. Light-Hammer 6 UV (Gaithersburg, Md.) processor equipped with an H-bulb, operating under nitrogen atmosphere at 75% lamp power at a line speed of 4.5 m/min (15 ft/min).

Fabrication of Nanostructured Film Having Multi-Periodic Zones

A nanostructured film with pitch domains was fabricated by first making multi-tipped diamonds as described in U.S. Pat. No. 7,140,812 (using a synthetic single crystal diamond, Sumitomo Diamond, Japan). Five different tools (Tools A-E, described below) were used to make five different nanostructured films.

For Tool A, the periods of the 1:1 triangular pitches (equal height to width) were chosen to be 420 nm, 520 nm, and 630 nm. The number of repeating periods in each set was chosen to be eight. The arrangement of the sets of the periods was first the set with a 420 nm period followed by the set with a 520 nm period and then the set with a 630 nm period. This was repeated twice (two zones) within the diamond cutting tool that measured about 25 μm after the arrangement of triangular pitches were milled into the cutting end.

For Tool B, the periods of the 1:1 triangular pitches (equal height to width) were chosen to be 420 nm, 520 nm, and 630 nm. The number of repeating periods in each set was chosen to be sixteen. The arrangement of the sets of the periods was first the set with a 420 nm period followed by the set with a 520 nm period and then the set with a 630 nm period. The diamond cutting tool measured about 25 μm after the arrangement of triangular pitches were milled into the cutting end.

For Tool C, the periods of the 1:1 triangular pitches (equal height to width) were chosen to be 420 nm, 520 nm, and 630 nm. The number of repeating periods in each set was chosen to be two. The arrangement of the sets of the periods was first the set with a 420 nm period followed by the set with a 520 nm period and then the set with a 630 nm period. This was repeated eight times within the diamond cutting tool that measured 24.5 μm after the arrangement of triangular pitches were milled into the cutting end.

For Tool D, the periods of the 1:1 triangular pitches (equal height to width) were chosen to be 520 nm, and 630 nm. The number of repeating periods in each set was chosen to be eight. The arrangement of the sets of the periods was first the set with a 520 nm period and then the set with a 630 nm period. This was repeated three times within the diamond cutting tool that measured about 27 μm after the arrangement of triangular pitches were milled into the cutting end.

For Tool E, the periods of the 1:1 triangular pitches (equal height to width) were chosen to be 375 nm, 562 nm, and 750 nm. The number of repeating periods in each set was chosen to be sixteen. The arrangement of the sets of the periods was first the set with a 750 nm period followed by the set with a 562 nm period and then the set with a 375 nm period. The diamond cutting tool measured about 26 μm after the arrangement of triangular pitches were milled into the cutting end.

Each diamond tool was then used to cut the purposely engineered arrangement in a copper tool so as to repeat across the width of the tool which was then used to make 1D engineered nanostructures with multi-periodic zones on a PET film in a continuous cast and cure process utilizing a polymerizable resin made by mixing 0.5% (2,4,6 trimethyl benzoyl)diphenyl phosphine oxide into a 75:25 blend of PHOTOMER 6210 and SR238.

HI-BF solution was coated onto the nanostructured film with pitch domains using a roll-to-roll coating process with a web speed of 3.0 m/min (10 ft/min) and a dispersion delivery rate of 2.28 cc/min. The coating was dried in air at room temperature, then subsequently further dried at 82° C. (180° F.) and then cured using a Fusion UV-Systems Inc. Light-Hammer 6 UV (Gaithersburg, Md.) processor equipped with an H-bulb, operating under nitrogen atmosphere at 75% lamp power at a line speed of 3.0 m/min (10 ft/min).

Figure 3:
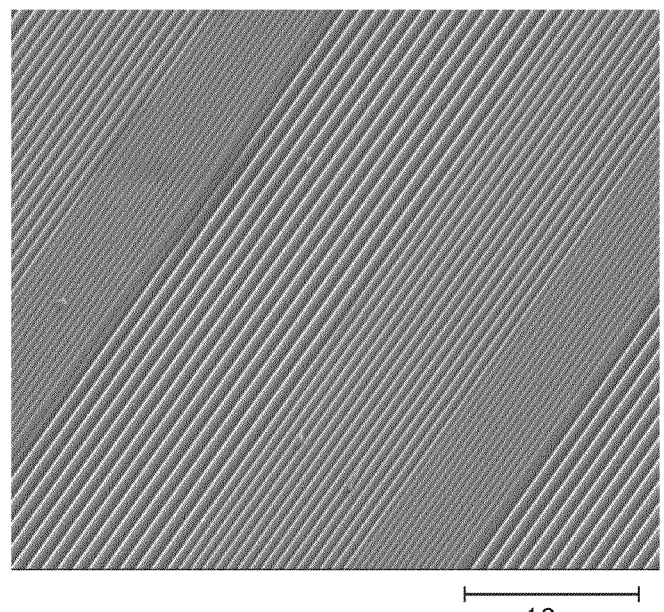
FIG. 3 is an image of a film with multi-periodic nanostructures for the Examples.

FIG. 3 is an image showing the nanostructured film made with Tool B.

Comparative Example C-1

Red, Green, and Blue OLEDs Built on 500 nm Pitch Nanostructured Film and Reference Glass Substrates An approximately 80 nm thick Indium-Tin-Oxide (ITO) layer was vacuum sputtered under direct current conditions (400 W forward power) onto backfilled 500 nm pitch 1D nanostructured at operating pressure of 5-7 mTorr to produce 5 mm wide ITO anode as defined by employed shadow masks. Sheet resistance of reference ITO samples was in the range of 40-70 Ohm/sq.

Subsequently, an OLED and cathode layers and cathode were deposited to complete the OLED. The red, green, and blue OLEDs were fabricated by standard thermal deposition in a vacuum system at base pressure of about $10^{-6}$ Ton in separate experiments for each prime color device set. Cathode layer was coated with a 5 mm wide shadow mask defining the 5×5 mm active area red, green, and blue devices in these experiments.

The following OLED construction was deposited for each prime color: HIL (300 nm)/HTL (40 nm)/Red, Green, or Blue EML (30 nm)/ETL (20 nm)/LiF (1 nm)/Al (200 nm). After completion, the OLED was encapsulated with an encapsulation barrier film (3M Company) employing SAES getter as a desiccant and oxygen scavenger in between the encapsulation film and the OLED device.

Similarly, control red, green, and blue OLEDs were fabricated using the same stacks on control polished soda-lime glass samples (Delta Technologies, Limited, Loveland, Colo.) with preliminarily sputtered ITO anode layer according to the procedure described above.

Constructed red, green, and blue OLED devices were characterized using a variety of electro-optical techniques, including angular luminance measurements using the AUTRONIC Conoscope (AUTRONIC-MELCHERS GmbH, Karlsruhe, Germany). In these measurements, all devices were operated under constant current corresponding to 10 mA/cm² current density for each operated device.

Conoscope measurements showed that red, green, and blue OLED samples made with the single-pitch (500 nm) 1D structured film showed strong dependence on the color of the device, producing small regions with relatively high intensity and somewhat larger regions with lower intensity surrounded by regions of relatively low intensity.

Delta u'v' white point angular shift was calculated according to CIE 1976 (L, u', v') color space metrics commonly used to evaluate white point color shift in display applications. In order to calculate the delta u'v' characteristic for the white point shift we chose a certain mixture of red, green, and blue emission of individual red, green, and blue OLED devices, which produced color coordinates of 0.3031, 0.3121 in CIE 1936 x,y color space in the angular direction corresponding to polar and azimuth angles both at 0° (on-axis viewing angle direction). Delta u'v' was calculated along two azimuthal directions in the angular space corresponding to the 1D grating vector direction and to the orthogonal direction. In the direction of the grating vector, which typically shows strongest variation in luminance with polar angle, delta u'v' of approximately 0.035 was obtained for variation within 0 to 60° polar angle. This delta u'v' value significantly exceeds the value of 0.02 which typically is considered to be the maximum delta u'v' value acceptable for display applications with minimally observable color shift with angle.

Thus, single-pitch 1D nanostructured light extraction film is expected to produce noticeable color variation with angle in display applications.

Example 1

Red, Green, and Blue OLEDs Built on Nanostructured Film Having Multi-Periodic Zones An approximately 80 nm thick Indium-Tin-Oxide (ITO) layer was vacuum sputtered under direct current conditions (400 W forward power) onto backfilled nanostructured film with pitch domains made using Tool A at operating pressure of 5-7 mTorr to produce a 5 mm wide ITO anode as defined by employed shadow masks. Sheet resistance of reference ITO samples was in the range of 40-70 Ohm/sq.

Subsequently, an OLED and cathode layers and cathode were deposited to complete the OLED. The red, green, and blue OLEDs were fabricated by standard thermal deposition in a vacuum system at base pressure of about $10^{-6}$ Ton in separate experiments for each prime color device set. The cathode layer was coated with a 5 mm wide shadow mask defining the 5×5 mm active area red, green, and blue devices in these experiments.

The following OLED construction was deposited for each prime color: HIL (300 nm)/HTL (40 nm)/Red, Green, or Blue EML (30 nm)/ETL (20 nm)/LiF (1 nm)/Al (200 nm). After completion, the OLED was encapsulated with an encapsulation barrier film (3M Company) employing SAES getter as a desiccant and oxygen scavenger in between the encapsulation film and the OLED device.

Similarly, control red, green, and blue OLEDs were fabricated using the same stacks on control polished soda-lime glass samples (Delta Technologies, Limited, Loveland, Colo.) with preliminarily sputtered ITO anode layer according to the procedure described above.

Constructed red, green. and blue OLED devices were characterized using a variety of electro-optical techniques, including angular luminance measurements using the AUTRONIC Conoscope (AUTRONIC-MELCHERS GmbH, Karlsruhe, Germany). In these measurements, all devices were operated under constant current corresponding to 10 mA/cm$^2$ current density for each operated device.

Conoscope measurements showed that red, green, and blue OLED samples made using film having engineered nanostructures with multi-periodic zones showed significantly smaller dependence on the color of the device, producing more uniform angular luminance distribution as compared with the Comparative Example C-1.

Delta u'v' white point angular shift was calculated according to CIE 1976 (L, u', v') color space metrics commonly used to evaluate white point color shift in display applications. In order to calculate the delta u'v' characteristic for the white point shift we chose a certain mixture of red, green, and blue emission of individual red, green, and blue OLED devices, which produced color coordinates of 0.3031, 0.3121 in CIE 1936 x,y color space in the angular direction corresponding to polar and azimuth angles both at 0° (on-axis viewing angle direction). Delta u'v' was calculated along two azimuthal directions in the angular space corresponding to the 1D grating vector direction and to the orthogonal direction. In the direction of the grating vector, which typically shows strongest variation in luminance with polar angle, delta u'v' of approximately <0.010 was obtained for variation within 0 to 60° polar angle. This delta u'v' value in notably lower than the value of 0.02 which typically is considered to be the maximum delta u'v' value acceptable for display applications with minimally observable color shift with angle.

Thus, a nanostructured light extraction film with multi-periodic zones is expected to produce very small color variation with angle in display applications. Since delta u' v' is significantly less than 0.02, the small color variation with angle cannot be noticed with a viewer's naked eye.

Moreover, strong on-axis and integrated optical gains of approximately 2× were observed in OLED devices built with the film having engineered nanostructures with multi-periodic zones. The gains were calculated as a ratio of luminance and/or efficiency values at a given current density value for patterned devices to the same characteristic value for control devices of a given color.

Examples 2-5

Green OLEDs Built on Nanostructured Film Having Multi-Periodic Zones

Figure 4A:
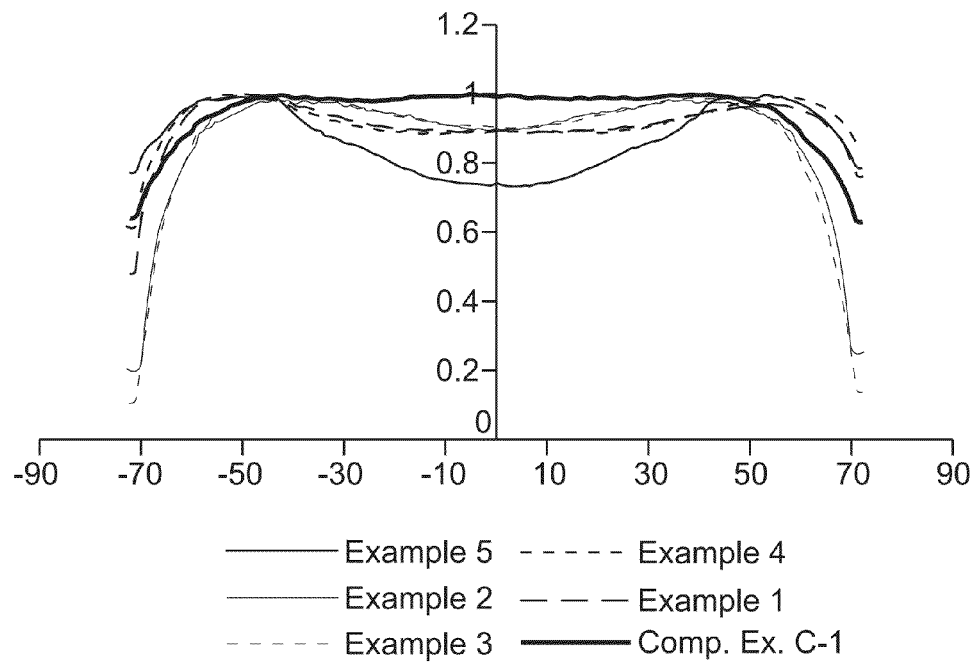
FIGS. 4A and 4B are graphs of conoscopic measurements for the Examples.
Figure 4B:
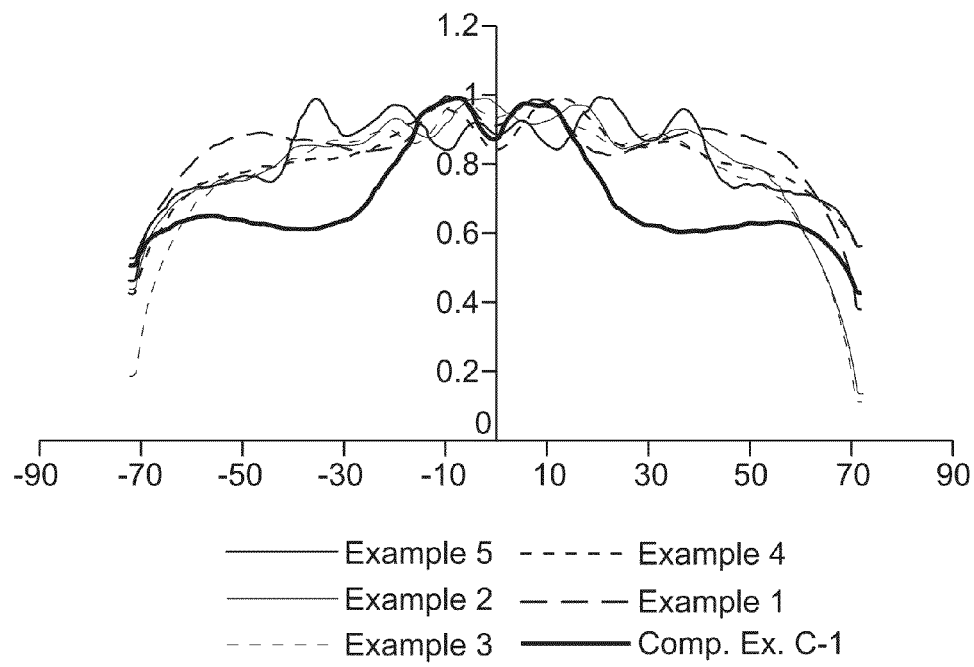

Green OLED devices were built as described in Example 1 except that Tools B-E were used to make the nanostructured film for Examples 2-5, respectively, instead of Tool A. Conoscope measurements were taken and are shown in FIGS. 4A and 4B for the 0° (on-axis viewing angle direction) and 90° azimuth, respectively. The integrated gain and on-axis gain for Examples 2-5 and for the green OLEDs from Example 1 and from Comparative Example C-1 are shown in Table 1. The gains are normalized so that the glass control has a mean gain of 1.

TABLE 1

| Example | On-Axis Gain | | Integrated Gain | |
|---|---|---|---|---|
| | Mean | Std. Dev. | Mean | Std. Dev. |
| 1 | 1.62 | 0.09 | 1.9 | 0.10 |
| 2 | 1.55 | 0.05 | 1.87 | 0.06 |
| 3 | 1.52 | 0.05 | 2.00 | 0.09 |
| 4 | 1.41 | 0.09 | 1.95 | 0.08 |
| 5 | 1.37 | 0.04 | 1.73 | 0.07 |
| C-1 | 1.48 | 0.03 | 1.73 | 0.03 |
| Glass Control | 1.00 | 0.07 | 1.00 | 0.06 |

The invention claimed is:

1. A light extraction film for enhancing light output from an organic light emitting diode (OLED) device, comprising:
    a flexible substrate substantially transparent to light emitted by the OLED device;
    a layer of engineered nanostructures applied to the substrate and having multi-periodic zones; and
    a backfill layer applied over the nanostructures and forming a substantially planar surface on a surface of the backfill layer opposite the nanostructures,
    wherein the backfill layer has an index of refraction greater than an index of refraction of the nanostructures,
    wherein the multi-periodic zones comprise a repeating zone of the nanostructures where the zone comprises a first set of nanostructures having a first periodic pitch and a second set of nanostructures having a second periodic pitch different from the first periodic pitch,
    wherein the first set of nanostructures have a first height, a first aspect ratio, and a first shape, and the second set of nanostructures have a second height, a second aspect ratio, and a second shape,
    wherein at least one of the first height, the first aspect ratio, and the first shape is different from, respectively, the second height, the second aspect ratio, and the second shape.

2. The light extraction film of claim 1, wherein the periodic structures are one-dimensional.

3. The light extraction film of claim 2, wherein the periodic structures comprise at least one of linear prisms, elongated ridges, and linear gratings.

4. The light extraction film of claim 1, wherein the periodic structures are two-dimensional.

5. The light extraction film of claim 4, wherein the periodic structures comprise at least one of pyramids, lenslets, trapezoids, round posts, and square posts.

6. The light extraction film of claim 1, wherein the periodic structures are formed integrally with the substrate.

7. The light extraction film of claim 1, further comprising an adhesive optical coupling layer applied to the substantially planar surface of the backfill layer.

8. The light extraction film of claim 1, where the planarizing backfill layer comprises an adhesive for bonding the light extraction film to a light output surface of the OLED device.

9. The light extraction film of claim 1, wherein the first shape comprises square ridges and the second shape comprises prisms.

10. The light extraction film of claim 1, wherein the first shape comprises square posts and the second shape comprises pyramids.

11. The light extraction film of claim 1, wherein the first pitch is different from the second pitch by the first height being different from the second height.

\* \* \* \* \*